(12) United States Patent
Matsudo et al.

(10) Patent No.: US 8,703,002 B2
(45) Date of Patent: Apr. 22, 2014

(54) PLASMA PROCESSING APPARATUS, PLASMA PROCESSING METHOD AND STORAGE MEDIUM

(71) Applicant: Tokyo Electron Limited, Tokyo (JP)

(72) Inventors: Tatsuo Matsudo, Nirasaki (JP); Shinji Himori, Nirasaki (JP); Noriaki Imai, Nirasaki (JP); Takeshi Ohse, Nirasaki (JP); Jun Abe, Nirasaki (JP); Takayuki Katsunuma, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/737,313

(22) Filed: Jan. 9, 2013

(65) Prior Publication Data

US 2013/0122714 A1 May 16, 2013

Related U.S. Application Data

(62) Division of application No. 12/192,388, filed on Aug. 15, 2008, now abandoned.

(60) Provisional application No. 60/991,803, filed on Dec. 3, 2007.

(30) Foreign Application Priority Data

Aug. 17, 2007 (JP) .................................. 2007-213170

(51) Int. Cl.
*H01L 21/3065* (2006.01)

(52) U.S. Cl.
USPC ............................................. 216/67; 438/725

(58) Field of Classification Search
None
See application file for complete search history.

(56) References Cited

U.S. PATENT DOCUMENTS

| | | | |
|---|---|---|---|
| 5,698,062 A | 12/1997 | Sakamoto et al. |
| 5,997,687 A | 12/1999 | Koshimizu |
| 6,009,828 A | 1/2000 | Tomita et al. |
| 6,074,518 A | 6/2000 | Imafuku et al. |
| 6,089,181 A | 7/2000 | Suemasa et al. |
| 6,110,287 A | 8/2000 | Arai et al. |

(Continued)

FOREIGN PATENT DOCUMENTS

| | | |
|---|---|---|
| CN | 1694228 A | 11/2005 |
| CN | 1783430 A | 6/2006 |

(Continued)

OTHER PUBLICATIONS

Search Report issued Jul. 26, 2010 in European Patent Application No. 08162504.8-1226/2026374.

(Continued)

*Primary Examiner* — Allan Olsen
(74) *Attorney, Agent, or Firm* — Rothwell, Figg, Ernst & Manbeck, P.C.

(57) ABSTRACT

A plasma processing apparatus includes a first radio frequency (RF) power supply unit for applying a first RF power for generating a plasma from a processing gas to at least one of a first and a second electrode which are disposed facing each other in an evacuable processing chamber. The first RF power supply unit is controlled by a control unit so that a first phase at which the first RF power has a first amplitude for generating a plasma and a second phase at which the first RF power has a second amplitude for generating substantially no plasma are alternately repeated at predetermined intervals.

8 Claims, 5 Drawing Sheets

(56) References Cited

U.S. PATENT DOCUMENTS

| | | |
|---|---|---|
| 6,165,376 A | 12/2000 | Miyake et al. |
| 6,214,162 B1 | 4/2001 | Koshimizu |
| 6,372,654 B1 | 4/2002 | Tokashiki |
| 6,433,297 B1 | 8/2002 | Kojima et al. |
| 6,562,190 B1 | 5/2003 | Kuthi et al. |
| 2001/0022293 A1 | 9/2001 | Maeda et al. |
| 2002/0081854 A1* | 6/2002 | Morrow et al. ............... 438/694 |
| 2004/0087166 A1* | 5/2004 | Morrow ........................ 438/694 |
| 2004/0195216 A1 | 10/2004 | Strang |
| 2004/0221958 A1 | 11/2004 | Loewenhardt et al. |
| 2004/0242021 A1 | 12/2004 | Kraus et al. |
| 2004/0250954 A1 | 12/2004 | Choe et al. |
| 2005/0103441 A1 | 5/2005 | Honda et al. |
| 2005/0183822 A1 | 8/2005 | Ono et al. |
| 2005/0224980 A1* | 10/2005 | Leu et al. ....................... 257/758 |
| 2005/0241762 A1 | 11/2005 | Paterson et al. |
| 2005/0285269 A1* | 12/2005 | Cao et al. ...................... 257/758 |
| 2006/0118044 A1 | 6/2006 | Himori et al. |
| 2006/0172532 A1* | 8/2006 | Morijiri et al. ................ 438/670 |
| 2006/0216944 A1 | 9/2006 | Kraus et al. |
| 2007/0117044 A1* | 5/2007 | Ogihara et al. ............ 430/270.1 |
| 2007/0184562 A1 | 8/2007 | Ono et al. |
| 2008/0026488 A1 | 1/2008 | Panda et al. |
| 2008/0230008 A1 | 9/2008 | Paterson et al. |
| 2010/0140221 A1 | 6/2010 | Kikuchi |
| 2011/0088850 A1* | 4/2011 | Honda et al. ............. 156/345.47 |

FOREIGN PATENT DOCUMENTS

| | | |
|---|---|---|
| JP | 64-73620 A | 3/1989 |
| JP | 8-288228 A | 11/1996 |
| JP | 10-340887 A | 12/1998 |
| JP | 2001-185542 A | 7/2001 |
| JP | 2001-313284 A | 11/2001 |
| JP | 2003-197536 A | 7/2003 |
| JP | 2006-186323 A | 7/2006 |
| JP | 2007-180358 A | 7/2007 |
| KR | 10-2003-0084546 A | 11/2003 |
| KR | 10-2006-0014424 A | 2/2006 |
| KR | 10-2006-0092790 A | 8/2006 |

OTHER PUBLICATIONS

Office Action issued Jul. 30, 2010 in Korean Patent Application No. 10-2008-0079816.

Chinese Office Action issued Jan. 19, 2011 in Patent Application No. 20810135193.6 (with English language translation).

Korean Office Action issued Aug. 5, 2011, in Patent Application No. 10-2008-0079816 (with English language translation).

Office Action issued Aug. 23, 2011 in China Application No. 200810135193.6 (with English translation).

\* cited by examiner

PLASMA PROCESSING APPARATUS, PLASMA PROCESSING METHOD AND STORAGE MEDIUM

CROSS REFERENCE TO RELATED APPLICATIONS

This application claims the benefit of priority of each of the following applications and describes the relationship of the earlier applications. The present application is a Divisional application of and claims the benefit of priority from co-pending U.S. application Ser. No. 12/192,388, filed Aug. 15, 2008, and also claims the benefit of priority from U.S. Provisional Application No. 60/991,803, filed on Dec. 3, 2007. The present application is further based upon and claims the benefit of priority from the prior Japanese Patent Application No. 2007-213170, filed on Aug. 17, 2007. The entire contents of foregoing applications are incorporated herein by reference.

FIELD OF THE INVENTION

The present invention relates to a technique for performing plasma processing on a target object; and, more particularly, to a capacitively coupled plasma processing apparatus, a plasma processing method and a storage medium storing a control program for executing the plasma processing method.

BACKGROUND OF THE INVENTION

In a manufacturing process of a semiconductor device or an FPD (flat panel display), a plasma is often used in processes, e.g., etching, deposition, oxidation, sputtering and the like, in order to allow a processing gas to react efficiently at a relatively low temperature. Conventionally, a capacitively coupled plasma processing apparatus is mainly used for a single-wafer plasma processing apparatus, especially a single-wafer plasma etching apparatus.

Generally, in the capacitively coupled plasma processing apparatus, an upper and a lower electrode are disposed in parallel with each other in a processing chamber as a vacuum chamber, and a target substrate (e.g., a semiconductor wafer, a glass substrate or the like) is mounted on the lower electrode. In that state, a radio frequency (RF) voltage is applied between the electrodes, and electrons are accelerated by an electric field formed between the electrodes by the application of the RF voltage. Plasma is generated due to ionization by collision between the electrons and the processing gas, and a desired microprocessing, e.g., etching, is performed on a substrate surface by radicals or ions in the plasma.

Along with the recent trend for miniaturization of a design rule in manufacturing a semiconductor device or the like, the high dimensional accuracy is required especially in the plasma etching and, hence, selectivity against an etching mask and an underlying layer and/or in-plane uniformity in the etching need to be improved. Accordingly, there arises a demand for low ion energy and low pressure in a processing region inside a chamber. For that reason, a RF power of about 40 MHz or greater has been used, which is significantly higher than that in a conventional case.

However, the low pressure and low ion energy causes charging damage that has not occurred conventionally. That is, in the conventional apparatus having high ion energy, in-plane distribution of a plasma potential does not cause a critical problem. However, if the ion energy decreases at a lower pressure, the in-plane non-uniformity of the plasma potential easily causes charging damage of a gate oxide film.

Further, in a plasma process using a RF power of a high frequency, e.g., 40 MHz or greater, it is a general trend that the etching rate at a central portion of a wafer becomes higher and the etching rate at a peripheral portion of the wafer becomes lower.

To that end, Japanese patent Laid-open Publication No. 2001-185542 and corresponding U.S. Pat. No. 6,624,084 describe an equipment including a current path correction means for correcting a current path part near an outer periphery of a wafer among RF current paths formed by a RF bias applied to the wafer so as to face a wafer facing surface of an opposite electrode or an impedance adjustment means for making am impedance up to a ground viewed from the RF bias almost uniform in the wafer surface. Accordingly, wafer in-plane uniformity of a self-bias generated by the RF bias application can be improved and, also, macro damage can be suppressed.

However, the technique disclosed in Japanese patent Laid-open Publication No. 2001-185542 and the corresponding U.S. Pat. No. 6,624,084 is disadvantageous in that the presence of the current path correcting means or the impedance adjustment means makes the equipment configuration complicated, and also in that the in-plane uniformity of the plasma processing may be insufficient.

Besides, in the plasma processing, there may occur charging damage as follows. The charge-up of the gate oxide film is caused by a local electric field produced by unbalance between ions and electrons in the wafer surface, which leads to dielectric breakdown. For example, in the plasma etching, the ions are injected perpendicularly to the main surface of the wafer, whereas the electrons are injected thereto at an inclined angle. Accordingly, the balance of charges is locally disturbed, and charge-up occurs in random locations. The charging damage depends on a profile of an etching pattern as well as in-plane uniformity of a self-bias, and occurs in random locations. Therefore, the problem of charging damage cannot be effectively solved by the technique described in Japanese patent Laid-open Publication No. 2001-185542 and the corresponding U.S. Pat. No. 6,624,084.

SUMMARY OF THE INVENTION

In view of the above, the present invention provides a plasma processing apparatus, method and a storage medium storing a control program for executing the plasma processing method for effectively preventing charging damage and improving stability and reliability of plasma processing and for enhancing the in-plane uniformity in the plasma processing.

In accordance with a first aspect of the invention, there is provided a plasma processing apparatus including: an evacuable processing chamber; a first electrode for mounting thereon a target object in the processing chamber; a second electrode facing the first electrode in parallel in the processing chamber; a processing gas supply unit for supplying desired processing gas to a processing space between the first electrode and the second electrode; a first radio frequency (RF) power supply unit for applying to at least one of the first and the second electrode a first RF power for generating a plasma from the processing gas; and a control unit for controlling the first RF power supply unit so that a first phase (period) at which the first RF power has a first amplitude for generating a plasma and a second phase (period) at which the first RF power has a second amplitude for generating substantially no plasma are alternately repeated at predetermined intervals.

In general, the charging damage (dielectric breakdown) in the plasma processing depends on the amount of charges introduced or accumulated in the target object from the plasma and an insulating film is deteriorated or destroyed exponentially when the amount of the introduced or accumulated charges exceeds a threshold value. In addition, the charge-up of the insulating film occurs due to unbalance between ions and electrons injected or introduced into the target object, thereby producing a local electric field. During the plasma generation, as time elapses, the amount of charges by the charged-up and the intensity of the local electric field increases. Further, when the amount of charges exceeds the threshold value, the insulating film is damaged or destroyed.

In the above configuration, even if the amount of the introduced or accumulated charges becomes excessive in random locations during a first phase at which the first RF power has a first amplitude for generating a plasma, the excessive charges are distributed (dispersed) during a second phase at which the plasma generation stops. Thus, the charge balance is recovered, and the damage of the insulating film is effectively prevented. As a result, the reliability of the plasma processing is greatly improved.

In the first aspect of the present invention, the second amplitude may be zero. Accordingly, the time at which the charge balance is recovered during the second period is minimized and, further, the plasma processing time can be shortened. Further, the first phase at which the plasma is generated may be about 2 to 100 μsec per cycle, preferably about 2 to 50 μsec per cycle. Meanwhile, the second phase at which no-plasma is generated may be greater than or equal to about 2 μsec per cycle.

In accordance with a second aspect of the invention, there is provided a plasma processing apparatus including: an evacuable processing chamber; a first electrode for mounting thereon a target object in the processing chamber; a second electrode facing the first electrode in parallel in the processing chamber; a processing gas supply unit for supplying desired processing gas to a processing space between the first electrode and the second electrode; a first RF power supply unit for applying a first RF power to at least one of the first and the second electrode; and a control unit for controlling the first RF power supply unit so that a state where a plasma is generated from the processing gas in the processing chamber and a state where no plasma is generated are alternately repeated at predetermined intervals during processing of the target object.

In the above configuration, during the processing of the target object, the state in which a plasma is generated from a processing gas (plasma generating state) and the state in which no plasma is generated (no-plasma generating state) are alternately repeated at predetermined intervals. Therefore, the time for continuously generating a plasma is shortened compared to the conventional plasma processing in which a plasma is continuously generated from start to end of the plasma processing, so that the amount of charges introduced from the plasma into the target object at a time or the amount of charges accumulated on the surface of the target object is reduced. Accordingly, the charging damage is hardly generated and, hence, it is possible to implement the stable plasma processing and improve the reliability of the plasma processing.

In the second aspect of the present invention, the duration of the plasma generating state may be about 2 to 100 μsec per cycle, preferably about 2 to 50 μsec per cycle. Meanwhile, the duration of the no-plasma generating state may be greater than or equal to about 2 μsec per cycle.

In the first and the second aspect of the present invention, the first RF power may have a frequency of about 30 to 300 MHz. Further, the first RF power supply unit may apply the first RF power to the first electrode. Moreover, the plasma processing apparatus may further includes a second RF power supply unit for applying to at least one of the first electrode and the second electrode a second RF power for attracting ions in the plasma to the target object. In this case, the second RF power supply unit may apply the second RF power to the first electrode.

In accordance with a third aspect of the invention, there is provided a plasma processing method for performing a plasma process on a target object by generating a plasma of a processing gas in a processing space with the use of a plasma processing apparatus including: an evacuable processing chamber; a first electrode for mounting thereon the target object in the processing chamber; a second electrode facing the first electrode in parallel in the processing chamber; a processing gas supply unit for supplying desired processing gas to the processing space between the first electrode and the second electrode; and a first RF power supply unit for applying to at least one of the first and the second electrode a first RF power for generating a plasma from the processing gas, wherein a first phase at which the first RF power has a first amplitude for generating a plasma and a second phase at which the first RF power has a second amplitude for generating substantially no plasma are alternately repeated at predetermined intervals.

In the above method, the first phase at which the first RF power for plasma generation has the first amplitude for plasma generation and the second phase at which substantially no plasma is generated are alternately repeated at predetermined intervals. Thus, the time for continuously generating a plasma is shortened compared to the conventional plasma processing in which a RF power having an amplitude for plasma generation is continuously applied and, hence, the amount of charges introduced from the plasma to the target object at a time or the amount of charges accumulated on the surface of the target object is reduced. As a consequence, the charging damage is hardly generated and, hence, it is possible to implement the stable plasma processing and improve the reliability of the plasma processing.

In the third aspect of the present invention, the second amplitude may be zero. Accordingly, in the second phase, the time at which no plasma is generated, i.e., at which the charge balance is recovered, is minimized and, further, the plasma processing time can be shortened. Further, the first phase at which plasma is generated may be about 2 to 100 μsec per cycle, preferably about 2 to 50 μsec per cycle. Meanwhile, the second phase at which no plasma is generated is greater than or equal to about 2 μsec per cycle.

In accordance with a fourth aspect of the invention, there is provided a plasma processing method for performing a plasma process on a target object by generating a plasma of a processing gas in a processing space with the use of a plasma processing apparatus including: an evacuable processing chamber; a first electrode for mounting thereon the target object in the processing chamber; a second electrode facing the first electrode in parallel in the processing chamber; a processing gas supply unit for supplying desired processing gas to the processing space between the first electrode and the second electrode; and a first RF power supply unit for applying a first RF power to at least one of the first and the second electrode, wherein a state where a plasma is generated from the processing gas in the processing chamber and a state where no-plasma is generated are alternately repeated at predetermined intervals during processing of the target object.

In the above method, during the processing of the target object, the state in which a plasma is generated from a processing gas (plasma generating state) and the state in which no plasma is generated (no-plasma generating state) are alternately repeated at predetermined intervals. Therefore, the time for continuously generating a plasma is shortened compared to the conventional plasma processing in which a plasma is continuously generated from start to end of the plasma processing, so that the amount of charges introduced from the plasma to the target object at a time or the amount of charges accumulated on the surface of the target object is reduced. Accordingly, the charging damage is hardly generated and, hence, it is possible to implement the stable plasma processing and improve the reliability of the plasma processing.

In the fourth aspect of the present invention, the duration of the plasma generating state may be about 2 to 100 µsec per cycle, preferably about 2 to 50 µsec per cycle. Meanwhile, the duration of the no-plasma generating state may be greater than or equal to about 2 µsec per cycle.

In the third and the fourth aspect of the present invention, the first RF power may have a frequency of about 30 to 300 MHz. Further, the first RF power supply unit may apply the first RF power to the first electrode. In addition, the plasma processing apparatus may further include a second RF power supply unit for applying to at least one of the first electrode and the second electrode a second RF power for attracting ions in the plasma to the target object. In this case, the second RF power supply unit may apply the second RF power to the first electrode.

In accordance with a fifth aspect of the invention, there is provided a storage medium storing a computer-executable control program for controlling a plasma processing apparatus including: an evacuable processing chamber; a first electrode for mounting thereon a target object in the processing chamber; a second electrode facing the first electrode in parallel in the processing chamber; a processing gas supply unit for supplying desired processing gas to a processing space between the first electrode and the second electrode; and a first RF power supply unit for applying to at least one of the first and the second electrode a first RF power for generating a plasma from the processing gas, wherein, when executed, the control program controls the plasma processing apparatus to perform the plasma processing method of the third and the fourth aspect of the present invention.

In accordance with the plasma processing apparatus, the plasma processing method and the storage medium storing a control program for executing the plasma processing method of the present invention, the above-described configuration and operation enable to prevent charging damage effectively to improve stability and reliability of plasma processing and to enhance the in-plane uniformity in the plasma processing.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE EMBODIMENT

Embodiments of the present invention will be described with reference to the accompanying drawings which form a part hereof.

Figure 1:
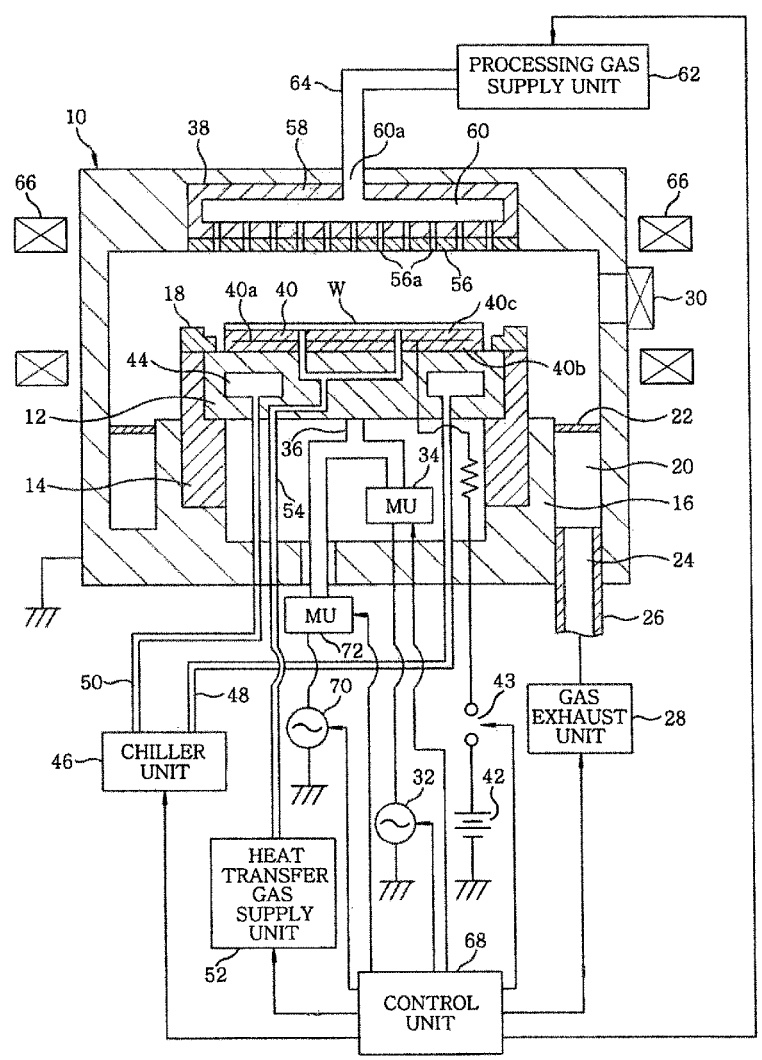
FIG. 1 is a vertical cross sectional view showing a configuration of a plasma processing apparatus in accordance with an embodiment of the present invention.

FIG. 1 shows a configuration of a plasma processing apparatus in accordance with an embodiment of the present invention. The plasma processing apparatus is configured as a capacitively coupled (parallel plate type) plasma etching apparatus wherein dual RF frequency powers are applied to a lower electrode, and has a cylindrical chamber (processing chamber) 10 made of a metal such as aluminum, stainless steel or the like. The chamber 10 is frame grounded.

A circular plate-shaped lower electrode or susceptor 12 for mounting thereon a target object (a substrate to be processed), e.g., a semiconductor wafer W, is installed in the chamber 10. The susceptor 12 is made of, e.g., aluminum, and is supported by a cylindrical support 16 vertically extended from a bottom of the chamber 10 via an cylindrical insulating member 14. On the top surface of the cylindrical insulating member 14, an annular focus ring 18 made of, e.g., quartz or silicon, surrounds the top surface of the susceptor 12.

A gas exhaust path 20 is formed between an inner wall of the chamber 10 and the cylindrical support 16. An annular baffle plate 22 is disposed at the entrance or in the middle of the gas exhaust path 20 and, also, a gas exhaust port 24 is provided at a bottom portion of the gas exhaust path 20. Further, a gas exhaust unit 28 is connected to the gas exhaust port 24 via a gas exhaust line 26. The gas exhaust unit 28 has a vacuum pump, so that a processing space in the chamber 10 can be depressurized to a desired vacuum level. Attached to a sidewall of the chamber 10 is a gate valve 26 for opening and closing a loading/unloading port for the semiconductor wafer W.

A first radio frequency (RF) power supply 32 for plasma generation is electrically connected to the susceptor 12 via a first matching unit (MU) 34 and a power feed rod 36. The first RF power supply 32 applies a predetermined first RF power of, e.g., 100 MHz, to the lower electrode, i.e., the susceptor 12. Further, a shower head 38 to be described later as an upper electrode of a ground potential is installed in a ceiling portion of the chamber 10. Accordingly, the first RF power from the first RF power supply 32 is applied between the susceptor 12 and the shower head 38.

Moreover, a second RF power supply 70 for ion attraction is electrically connected to the susceptor 12 via a second matching unit (MU) 72 and a power feed rod 36. The second RF power supply 70 applies a predetermined second RF power of, e.g., 3.2 MHz, to the susceptor 12.

Disposed on the top surface of the susceptor 12 is an electrostatic chuck 40 for supporting the semiconductor wafer W by an electrostatic attractive force. The electrostatic chuck 40 includes an electrode 40a made of a conductive film embedded between a pair of insulating films 40b and 40c. A DC power supply 42 is electrically connected to the electrode 40a via a switch 43. By a Coulomb force generated by a DC voltage from the DC power supply 42, the semiconductor wafer W can be attracted and held on the chuck.

Installed in the susceptor 12 is a coolant passageway 44 extended in, e.g., a circumferential direction. A coolant of a predetermined temperature, e.g., cooling water, from a chiller unit 46 is circulated in the coolant passageway 44 via lines 48 and 50. The processing temperature of the semiconductor wafer W on the electrostatic chuck 40 can be controlled by the temperature of the coolant. Further, a heat transfer gas, e.g., He gas, from a heat transfer gas supply unit 52 is supplied between the top surface of the electrostatic chuck 40 and the backside of the semiconductor wafer W via a gas supply line 54.

The shower head 38 on the ceiling portion includes an electrode plate 56 having a plurality of gas vent-holes 56*a* in the bottom surface and an electrode supporting member 58 for detachably holding the electrode plate 56. A buffer space 60 is provided in the electrode supporting member 58, and a gas supply line 64 extending from a processing gas supply unit 62 is connected to a gas inlet opening 60*a* of the buffer space 60.

A magnet 66 is annually or concentrically disposed around the chamber 10. A vertical RF electric field is formed by the first RF power supply 32 in the gap between the shower head 38 and the susceptor 12 in the chamber 10. By discharging the first RF power, a high density plasma can be generated around the surface of the susceptor 12.

A controller 68 controls an operation of each unit in the plasma etching apparatus such as the gas exhaust unit 28, the first RF power supply 32, the first matching unit 34, the chiller unit 46, the heat transfer gas supply unit 52, the processing gas supply unit 62, the second RF power supply 70, the second matching unit 72 and the like. In addition, the controller 68 is connected to a host computer (not shown) and the like.

To carry out an etching in the plasma etching apparatus, first of all, the gate valve 30 is opened. Next, a semiconductor wafer W to be processed is loaded into the chamber 10 to be mounted on the electrostatic chuck 40. Thereafter, an etching gas (generally a gaseous mixture) from the processing gas supply unit 62 is introduced into the chamber 10 at a predetermined flow rate and flow rate ratio, and the pressure in the chamber 10 is set to be a preset value by the gas exhaust unit 28. Moreover, the first RF power from the first RF power supply 32 is supplied to the susceptor 12 with a predetermined power and, at the same time, the second RF power from the second RF power supply 70 is supplied to the susceptor 12 with a predetermined power. Further, a DC voltage from the DC power supply 42 is applied to the electrode 40*a* of the electrostatic chuck 40, thus holding the semiconductor wafer W on the electrostatic chuck 40. The etching gas injected from the shower head 38 is converted to a plasma between both electrodes 12 and 38 by the first RF discharge, and the main surface of the semiconductor wafer W is etched by radicals or ions generated by the plasma.

In the plasma etching apparatus, by applying the first RF power having a radio frequency (30 MHz or higher) higher than the conventional frequency from the first RF power supply 42 to the susceptor (lower electrode) 12, a high-density plasma in a desirable dissociated state can be generated even at a lower pressure.

The increase of the plasma density leads to the low ion energy, i.e., the decrease of the sheath potential (voltage) on the semiconductor wafer W (the low bias). As the bias is reduced compared to the conventional case, the effect of the charging damage (dielectric breakdown) cannot be ignored. The charging damage occurs when the amount of charges introduced from the plasma to the semiconductor wafer W exceeds the threshold value. The amount of introduced charges is affected by the relative variation of the sheath potential in the surface of the wafer W.

In the conventional plasma etching apparatus using a low RF power, a sheath potential is high as several hundreds of voltages. Thus, even if in-plane non-uniformity occurs in the potential of the plasma (plasma potential), the variation in the sheath potential is relatively small in the wafer surface and, also, the amount of electrons introduced into a gate electrode of the semiconductor wafer W does not exceed the threshold value.

However, in the high-density plasma of the present embodiment, the sheath potential is low as several tens of voltages. Therefore, when the in-plane non-uniformity occurs in the plasma potential, the variation in the sheath potential is relatively large and, also, a large amount of electrons are easily introduced into the gate electrode. In addition, the charging damage easily occurs in accordance with the length of time at which the substrate surface is continuously exposed to the plasma.

Moreover, in the plasma processing, the charge-up may occur in the insulating film (e.g., the gate oxide film) on the substrate by the local unbalance between ions and electrons due to the in-plane non-uniformity of the plasma potential or the profile of the circuit pattern. In the insulating film where the charge-up occurs, an electric field or a potential gradient in proportion to the amount of accumulated charges is established. If the amount of the accumulated charge exceeds the threshold value, the insulating film is damaged or destroyed in corresponding locations.

In the present embodiment, the plasma generating state and the no-plasma generating state (where no plasma is generated) are alternately repeated at predetermined intervals so that the amount of charges introduced into the gate electrode or the amount of charges accumulated on the insulating film does not exceed the threshold value. Specifically, the continuous plasma generation is performed for a short period of time at which the amount of introduced charges or the accumulated charges does not exceed the threshold value and, then, no-plasma generating state is set. Further, the plasma generating state and the plasma non-generating state are repeated intermittently. Therefore, even if the charge-up occurs or the excessive amount of charges are introduced in random locations on the wafer W during the plasma generating state, the excessive amount of introduced charges or accumulated charges are distributed during the no-plasma generating state to make the wafer W neutralized. Accordingly, it is possible to avoid the increase of the introduced charges or the accumulated charges, and also possible to effectively prevent the damage of the insulating film. As a result, the reliability of the plasma processing can be greatly improved.

In order to repeat the plasma generating state and the no-plasma generating state during the plasma etching, in the present embodiment, the first RF power supply 32 and the first matching unit 34 are controlled by the control unit 68 so that a first phase at which a first RF power has a peak value or a first amplitude at which a plasma is generated (i.e., an effective power) and a second phase at which the first RF power has a peak value or a second amplitude at which no plasma is generated (i.e., an ineffective power) can be alternately repeated at predetermined intervals. Further, the present invention includes the case where the second amplitude is zero (i.e., the first RF power is not applied).

To be more specific, the first RF power outputted from the first RF power supply 32 is modulated and applied to the susceptor 12. As for a typical example of power modulation, there can be employed a pulse modulation shown in FIG. 2.

Figure 2:
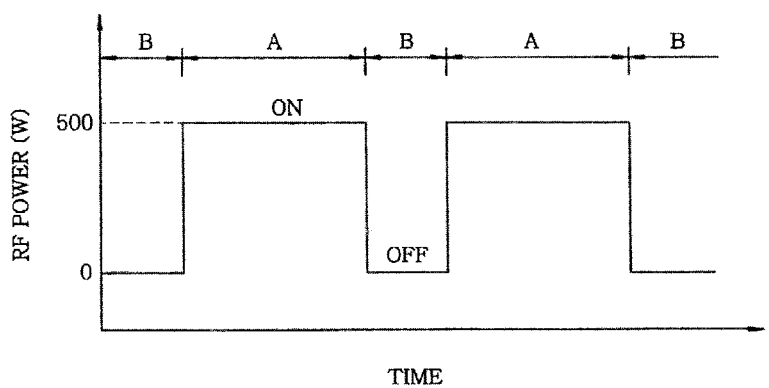
FIG. 2 depicts characteristics of RF power with respect to time in pulse plasma.
Figure 3:
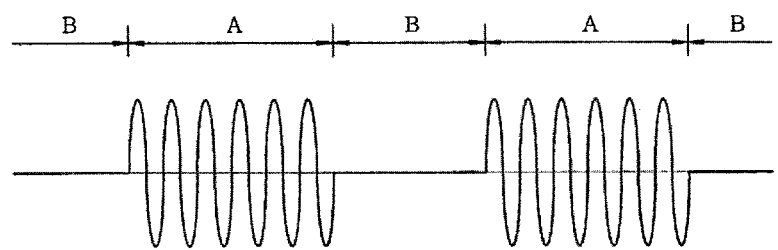
FIG. 3 illustrates a waveform of a first RF power in the pulse plasma of FIG. 2.

In FIG. 2, a period A indicates the plasma generating state, and a period B represents the no-plasma generating state. In the plasma generating period A, the first RF power having a first amplitude of about 500 W is applied to the RF electrode 12. In the no-plasma generating period B, the first RF power has a second amplitude of 0 W. That is, the first RF power is alternately ON and OFF, generating a pulse plasma in the chamber 10. In this case, the first RF has a waveform shown in FIG. 3.

The second amplitude in the no-plasma generating state is not limited to 0 W, and may be a power level at which substantially no plasma is generated. Moreover, the first amplitude in the plasma generating state is not limited to 500 W, and may be set between about 100 W and about 2000 W depending on the processing conditions.

Figure 4:
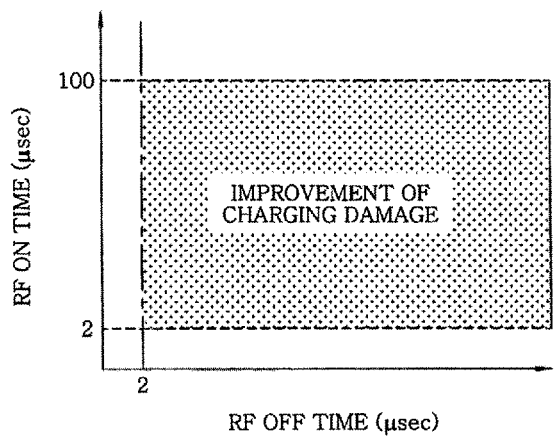
FIG. 4 describes an optimal range of a plasma generating period A and a no-plasma generating period B.

Although it is important to define the first and the second amplitude, it is also important to define the duration of the plasma generating period A and the no-plasma generating period B so that the amount of charges introduced to the gate electrode or the amount of charges accumulated on the gate oxide film does not exceed the threshold value. FIG. 4 illustrates desirable ranges of the plasma generating period A and the no-plasma generating period B in the case of applying the first RF power in a pulse shape as shown in FIG. 2 (the first amplitude of about 500 W and the second amplitude of 0 W).

Referring to FIG. 4, it is preferable that the plasma generating period A is longer than or equal to about 2 μsec or shorter than or equal to about 100 μsec, and also that the plasma non-generating period B is longer than or equal to about 2 μsec. Further, it is more preferable that the plasma generating period A is longer than or equal to about 2 μsec or shorter than or equal to about 50 μsec. When the plasma generating period A is longer than about 100 μsec, the amount of introduced charges or the amount of accumulated charges exceeds the threshold value, and the charging damage occurs. Meanwhile, when the plasma generating period A is shorter than about 2 μsec, the plasma is generated unstably and, also, the efficiency of the plasma processing deteriorates. When the no-plasma generating period B is shorter than about 2 μsec, the plasma cannot be completely extinguished, which leads to a case similar to one where only the plasma generating period A is continued, i.e., the same case as the conventional plasma processing in which a plasma is continuously generated for a long period of time, so that the charging damage easily occurs. Even if the no-plasma generating period B is lengthened, the etching result is not affected.

In the pulse plasma generated by applying the first RF power in a pulse shape, the plasma generating period A and the no-plasma generating period B are repeated at predetermined intervals. Therefore, the total etching time from start to end of the etching process becomes longer compared to the case of performing etching while maintaining the plasma generating state all the time. In order to improve the etching efficiency and the throughput, it is required to increase a duty ratio of the pulse plasma, i.e., (the plasma generating period A)/{(the plasma generating period A)+(the no-plasma generating period B)}. Accordingly, in view of increasing the etching efficiency, it is preferable to shorten the no-plasma generating period B although the upper limit of the plasma non-generating period B is not particularly defined in view of the etching result.

As can be seen from FIG. 2, the maximum length of the plasma generating period A and the minimum length of the no-plasma generating period B are about 100 μsec and about 2 μsec, respectively. Therefore, the maximum duty ratio at which the best etching efficiency is obtained is about 98%. Meanwhile, the minimum duty ratio is preferably about 50% in view of the etching efficiency. In other words, it is preferable that the plasma generating period A is equal to the no-plasma generating period B.

The maximum duty ratio of 98% means that the etching time is reduced by 2% compared to the case where the etching is performed while continuously maintaining the plasma generating state from start to end of the processing. Accordingly, it is possible to reliably prevent the charging damage while obtaining the etching efficiency substantially same as that of the conventional plasma processing.

Preferably, the frequency of the power modulation, i.e., the frequency of the pulse plasma, is about 5 to 250 kHz. In the example of FIG. 4, the minimum length of the plasma generating period A and that of the no-plasma generating period B are about 2 μsec. Accordingly, the shortest cycle is about 4 μsec, and the frequency at this time is set to about 250 kHz. Further, the maximum length of the plasma generating period A and that of the no-plasma generating period B are about 100 μsec. Therefore, the longest cycle is about 200 μsec, and the frequency at this time is set to about 5 kHz.

Figure 5:
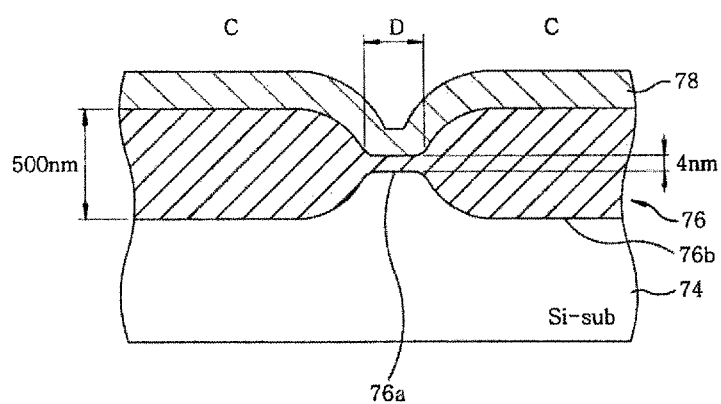
FIG. 5 provides a schematic view of a device structure for testing resistance to charging damage.

The following is description of the result of the test in which the charging damage resistance of the pulse plasma is tested by using a test wafer. In this test, there was used a device having a structure of FIG. 5 in which an $SiO_2$ film 76 and a polysilicon film 78 are formed on a Si substrate 74 in that order, the $SiO_2$ film 76 including a gate oxide film corresponding portion 76a having a thickness of about 4 nm and a device isolation region 76b having a thickness of about 500 nm A plurality of such devices are formed on the wafer in a matrix cell array. The area C of the device isolation region 76b is set to be 10,000 or 100,000 times greater than the area D of the gate oxide film corresponding portion 76a, and the charging damage readily occurs as in a conventional stress test.

As for a wafer, a wafer having a diameter of 300 mm was used. The plasma processing was performed by using the apparatus shown in FIG. 1. At this time, the wafer was exposed to the plasma under the following conditions.

Pressure in the chamber: 20 mTorr
Processing gas: $O_2$ gas
Flow rate of processing gas: 200 sccm
First RF: 100 MHz
First RF power: 500 W
Processing time: 100 seconds.

Further, the second RF power output from the second RF power supply 70 was not used (applied). At this time, a leakage current of each device was measured. When the leakage current was greater than or equal to about $1\times10^{-9}$ Å/μm$^2$, it was considered that the dielectric breakdown has occurred. On the contrary, when the leakage current was smaller than that, it was considered that the dielectric breakdown has not occurred.

Figure 6A:
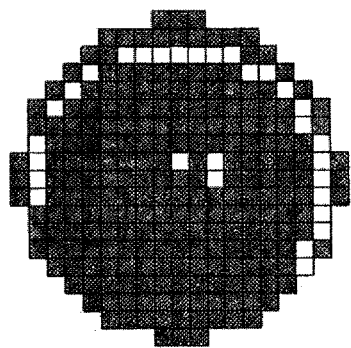
FIGS. 6A to 6C depict comparison of occurrence of charging damage between a conventional case (comparative example) and the present invention.
Figure 6B:
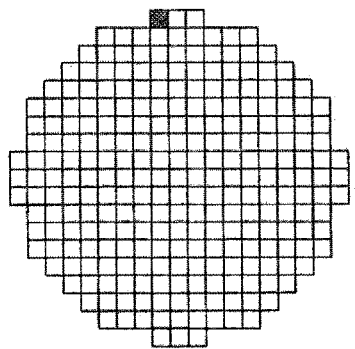
Figure 6C:
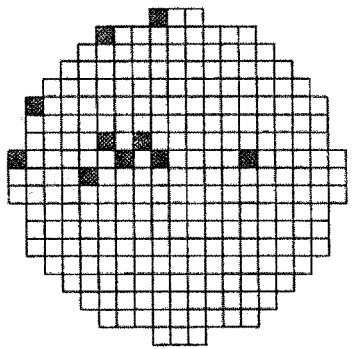
Figure 7A:
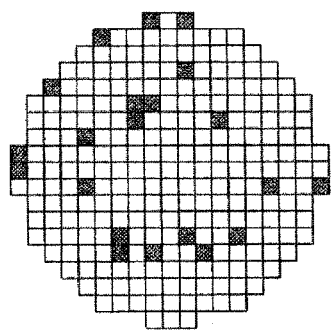
FIGS. 7A to 7C show comparison of occurrence of charging damage between a conventional case (comparative example) and the present invention.
Figure 7B:
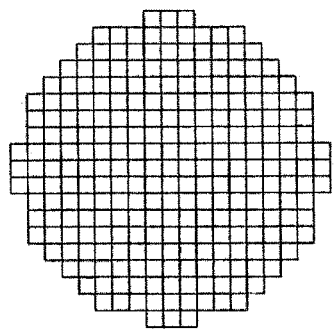
Figure 7C:
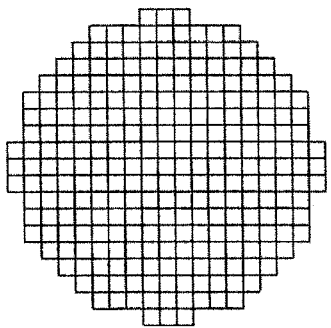

The test results are shown in FIGS. 6A to 6C and 7A to 7C. FIGS. 6A to 6C show the case where the area C of the device isolation region 76b is 100,000 times larger than that of the gate oxide film corresponding portion 76a, and FIGS. 7A to 7C show the case where the area C of the device isolation region 76b is 10,000 times larger than that of the gate oxide film corresponding portion 76a. FIGS. 6A and 7A illustrate the wafers exposed to the conventional continuous plasma; FIGS. 6B and 7B illustrate the wafers exposed to the pulse plasma under the conditions of the plasma generating period A of about 40 μsec, the duty ratio of about 20% and the modulation frequency (pulse frequency) of about 5 kHz; and FIGS. 6C and 7C illustrate the wafers exposed to the pulse plasma under the conditions of the plasma generating period A of about 5 μsec, the duty ratio of about 50% and the modulation frequency of about 100 kHz. A white region indicates a region where dielectric breakdown has not occurred, and a black region represents a region where dielectric breakdown has occurred.

In the case where the area ratio (C/D) was 100,000 as shown in FIGS. 6A to 6C, when the conventional continuous plasma was used, the dielectric breakdown occurred in a plurality of devices, and only 11% of the devices were free from the dielectric breakdown. However, when the pulse plasma was used, the production yield obtained after the plasma generating time of about 40 μsec was about 99%, and the production yield obtained after the plasma generating time of about 5 μsec was about 96%. That is, the charging damage was greatly reduced. In the case where the area ration (C/D) was 10,000 as shown in FIGS. 7A to 7C, when the conventional continuous plasma was used, 87% of the devices were free from the dielectric breakdown. However, when the pulse plasma was used, the production yield after the plasma generating period of about 40 μsec, and the production yield obtained after the plasma generating period of about 5 μsec were about 100%. Further, the charging damage did not occur in any location in the wafer surface.

In accordance with the above embodiment, even at the duty ratio of 50%, it is possible to obtain the production yield of substantially 100% until an antenna ratio of 100 k.

Although there has been described, in the aforementioned embodiment, the effect that the generation of the charging damage is prevented, it is also possible to enhance the uniformity of the plasma processing rate (etching rate) by alternately repeating the plasma generating state and the no-plasma generating state at predetermined intervals.

In a conventional plasma etching apparatus wherein an etching is performed using a RF power having a high frequency of 40 MHz or greater while maintaining the plasma generating state all the time, it is a general trend that the etching rate at the central portion of the wafer becomes higher and the etching rate at the peripheral portion becomes lower. In other words, the plasma generated by the first RF power outputted from the first RF power supply 32 has a higher density distribution at the central portion of the wafer and a lower density distribution at the peripheral portion of the wafer.

However, in the present embodiment, it is possible to suppress the increase in the etching rate at the central portion of the wafer by alternately repeating the plasma generating state and the no-plasma generating state at predetermined intervals. As a result, it is possible to obtain a uniform etching rate in the surface of the wafer.

Here, there will be described comparative measurement results obtained by performing an etching using the pulse plasma (pulse etching) and a conventional etching wherein the plasma generating state is kept all the time (conventional etching).

A wafer having a diameter of 300 mm was used and an organic film on the wafer was etched. The plasma etching was carried out by using the plasma processing apparatus shown in FIG. 1 under the following conditions:
Pressure in the chamber: 10 mTorr
Processing gas: $N_2/O_2/CO$
Flow rate of the processing gas: 200/60/100 sccm
First RF: 100 MHz
Second RF: 3.2 MHz
Second RF power: 200 W
Processing time: 30 seconds.

In the pulse etching, the plasma generating period A by using the first RF power was set to 500 μsec, the first RF power in the plasma generating period A was set to 1500 W, the first RF power in the no-plasma generating period B was set to 0 W, the duty ratio was set to 50% and the modulation frequency (pulse plasma) was set to 1 kHz. On the other hand, in the conventional etching, the first RF power was set to 1500 W.

The results indicated that while the in-plane uniformity was 13.8% in the conventional etching, it was significantly increased to 9.5% in the pulse etching. Accordingly, it has been experimentally proved that it is possible to obtain a uniform etching rate in the surface of the wafer by alternately repeating the plasma generating state and the no-plasma generating state at predetermined intervals. The conditions of the plasma generating period A (500 μsec) and the modulation frequency (1 kHz) in this comparative test were set different from the plasma generating period A (2-100 μsec, preferably 2-50 μsec) and the modulation frequency (5-250 kHz) optimal to prevent the charging damage as described above. However, it can be readily appreciated that the plasma generating period A and the modulation frequency optimal to prevent the charging damage would enhance the in-plane uniformity in the etching rate.

Although the pulse plasma is described in the above embodiment, any plasma can be used other than the pulse plasma as long as the plasma generating state and the no-plasma generating state are alternately repeated at predetermined intervals.

The plasma processing apparatus in the above embodiment is of the type that the first RF power for plasma generation and the second RF power for ion attraction are applied to the susceptor 12. However, as for another embodiment, although it is not illustrated, it is possible to use an apparatus of a type in which a single RF power for plasma generation is applied to the lower electrode. In addition, although it is not illustrated, there may be employed an apparatus of a type in which an RF power for plasma generation is applied to the upper electrode. In that case, an RF power for ion attraction can be applied to the lower electrode. Preferably, the RF power for plasma generation has a frequency of about 30 MHz to 300 MHz.

Moreover, the present invention can be applied to other various plasma processing apparatuses for performing plasma CVD, plasma oxidation, plasma nitriding, sputtering and the like. Further, the target object in the present invention is not limited to the semiconductor wafer, but may be one of various substrates for a flat panel display, a photo mask, a CD substrate, a printed circuit board or the like.

While the invention has been shown and described with respect to the embodiments, it will be understood by those skilled in the art that various changes and modification may be made without departing from the scope of the invention as defined in the following claims.

What is claimed is:

1. A plasma etching method for performing an etching process on a target object by generating a plasma of a processing gas in a processing space of a plasma etching apparatus that includes an evacuable processing chamber, a first electrode for mounting thereon the target object in the processing chamber, a second electrode facing the first electrode in parallel in the processing chamber and having a ground potential, a processing gas supply unit for supplying processing gas, including $O_2$ gas, to the processing space between the first electrode and the second electrode, and a RF power supply unit for applying to the first electrode RF power having a frequency greater than or equal to 30 MHz, the method comprising:

etching a target object that includes a polysilicon film formed on a gate oxide film by repeating a cycle that alternates between a first phase and a second phase, wherein, during the first phase, RF power is applied to the first electrode with a first amplitude that generates a plasma from the processing gas and, during the second phase, the RF power is applied to the first electrode with a second amplitude that generates substantially no plasma, wherein the length of the first phase is about 2 to 50 μsec and the length of the second phase is greater than or equal to about 2 μsec, and wherein the length of the cycle is about 4 to 200 μsec.

2. The plasma etching method of claim 1, wherein etching the target object includes introducing, during the first phase, an amount of charge that does not exceed a threshold into the gate oxide film from the plasma, wherein the threshold is a maximum amount of accumulated charge that does not damage the gate oxide film.

3. The plasma etching method of claim 1, wherein the second amplitude during the second phase is not zero.

4. The plasma etching method of claim 1, wherein the length of the first phase is about 40 μsec, and wherein a duty ratio of the first phase is about 20%.

5. The plasma etching method of claim 1, wherein the length of the first phase is about 40 μsec, and wherein a duty ratio of the first phase is about 20%.

6. A plasma etching method for performing an etching process on a target object by generating a plasma of a processing gas in a processing space of a plasma etching apparatus that includes an evacuable processing chamber, a first electrode for mounting thereon the target object in the processing chamber, a second electrode facing the first electrode in parallel in the processing chamber and having a ground potential, a processing gas supply unit for supplying processing gas, including $O_2$ gas, to the processing space between the first electrode and the second electrode, and a RF power supply unit for applying RF power to the first electrode, the RF power having a frequency greater than or equal to 30 MHz, the method comprising:

etching a target object that includes a polysilicon film formed on a gate oxide film by repeating a cycle that alternates between a first phase and a second phase during etching of the target object, wherein, during the first phase, a plasma is continuously generated from the processing gas in the processing chamber and, during the second phase, no plasma is generated, wherein the length of the first phase is about 2 to 50 μsec and the length of the second phase is greater than or equal to about 2 μsec, and wherein the length of the cycle is about 4 to 200 μsec.

7. The plasma etching method of claim 6, wherein etching the target object includes introducing, during the first phase, an amount of charge that does not exceed a threshold into the gate oxide film from the plasma, wherein the threshold is a maximum amount of accumulated charge that does not damage the gate oxide film.

8. The plasma etching method of claim 6, wherein an amplitude of the RF power during the second phase is not zero.

* * * * *